United States Patent [19]

Abele

[11] Patent Number: 5,213,948
[45] Date of Patent: May 25, 1993

[54] PHOTOPOLYMERIZABLE PRINTING PLATE FOR FLEXOGRAPHIC PRINTING

[75] Inventor: Werner Abele, Neu-Isenburg, Fed. Rep. of Germany

[73] Assignee: E. I. Du Pont de Nemours and Company, Wilmington, Del.

[21] Appl. No.: 726,474

[22] Filed: Jul. 8, 1991

[30] Foreign Application Priority Data

Jul. 19, 1990 [DE] Fed. Rep. of Germany ....... 4022980

[51] Int. Cl.$^5$ ................................................ G03F 7/11
[52] U.S. Cl. ...................................... 430/272; 430/273; 430/306
[58] Field of Search .................. 430/273, 272, 306

[56] References Cited

U.S. PATENT DOCUMENTS

| | | | |
|---|---|---|---|
| 4,162,919 | 7/1979 | Richter et al. | 96/87 |
| 4,266,005 | 5/1981 | Nakamura et al. | 430/271 |
| 4,320,188 | 3/1982 | Heinz et al. | 430/281 |
| 4,323,636 | 4/1982 | Chen | 430/271 |
| 4,323,637 | 4/1982 | Chen et al. | 430/271 |
| 4,369,246 | 1/1983 | Chen et al. | 430/306 |
| 4,423,135 | 12/1983 | Chen et al. | 430/271 |
| 4,427,759 | 1/1984 | Gruetzmacher et al. | 430/273 |
| 4,430,417 | 2/1984 | Heinz et al. | 430/286 |
| 4,460,675 | 7/1984 | Gruetzmacher et al. | 430/300 |
| 4,734,476 | 3/1988 | Sato et al. | 526/304 |
| 4,857,434 | 8/1989 | Klinger | 430/286 |

FOREIGN PATENT DOCUMENTS 2509842 9/1975 Fed. Rep. of Germany .
3744243 2/1989 Fed. Rep. of Germany .

*Primary Examiner*—Cynthia Hamilton

[57] ABSTRACT

A photopolymerizable printing element comprising a photopolymerizable layer and an elastomeric layer applied thereon wherein said elastomeric layer further comprises at least one thermoplastic, elastomeric block copolymer and at least one polymer with a structural unit containing a maleic acid half ester group. The element produces flexographic printing plates having improved printing performance with aqueous and alcoholic printing inks.

8 Claims, No Drawings

PHOTOPOLYMERIZABLE PRINTING PLATE FOR FLEXOGRAPHIC PRINTING

OF THE INVENTION

This invention relates to flexographic printing plates and more particularly to a photopolymerizable printing element comprising a photopolymerizable layer and an elastomeric layer coated thereon wherein the elastomeric layer further comprises at least one thermoplastic, elastomeric block copolymer and at least one polymer with a structural unit containing a maleic acid half ester group.

BACKGROUND OF THE INVENTION

Photopolymerizable recording materials are known for use in preparing printing plates for flexographic printing. Such materials are used to make printing plates by first exposing imagewise a light-sensitive layer followed by removal of the unexposed areas. In this art area, solid, photopolymerizable materials are differentiated from those in which the imagewise exposure is conducted in liquid systems. In addition, there are photopolymerizable recording materials that are aqueous-developable and those that are organic-solvent developable.

EP-A2 02 61 890 (U.S. Pat. No. 4,857,434) discloses an aqueous-developable, liquid system using liquid hydrocarbon/maleate polymers, soluble in an aqueous medium, with (meth)acrylic acid groups and maleic acid half ester groups linked through ester groups.

Aqueous-developable printing plates are also described in DE-A1 25 09 842. The plate contains a binder of a copolymer that is soluble in aqueous alkaline solutions of unsaturated carboxylic acids and hydroxyalkyl (meth)acrylates, and which can also react with, among others, cyclic acid anhydrides to half esters. Similar binders with added amino or ammonium groups are also described in EP-A3 02 06 412 (U.S. Pat. No. 4,734,476), for preparing color filters, that is, after exposure and washoff, the layers are permanently colored with dye solutions.

There are several disadvantages to using liquid systems. First, liquid systems require commercially expensive processing. In addition, compared to organic-solvent developable printing plates, aqueous-developable printing plates have low stability to alcoholic and aqueous printing inks. Such low stability causes swelling of the printing surface which results in defective printing.

Examples of solid, solvent-developable recording materials are disclosed in the following patents: DE-C3 22 15 090 (U.S. Pat. Nos. 4,323,636; 4,323,637; 4,369,246; 4,423,135); U.S. Pat. No. 4,266,005; U.S. Pat. No. 4,320,188; and U.S. Pat. No. 4,430,417. Photopolymerizable printing plates prepared from solvent-developable recording materials usually comprise a support, an optional adhesive or other undercoating, a photopolymerizable layer having at least one polymeric binder, at least one ethylenically unsaturated monomer addition-polymerizable by actinic light, and a photoinitiator or photoinitiator system, and a cover element consisting of a flexible, polymeric film soluble in the developer solution and a separable cover sheet.

A preferred method for preparing printing plates from such multilayer, photopolymerizable elements is a process in which a previously extruded photopolymerizable composition is fed into the nip of a calender and calendered between a support and a cover element to form a photopolymerizable layer between them.

EP-B1 00 84 851 (U.S. Pat. Nos. 4,427,759 and 4,460,675), discloses preparing a multilayer, photopolymerizable printing element wherein an elastomeric layer is interposed between the flexible polymeric film of the cover element and the photopolymerizable layer. The elastomeric layer contains an elastomeric binder, and as optional constituents, a second binder, a dye, one or more monomers, and a photoinitiator.

A disadvantage to preparing solvent-developable flexographic printing plates from the above-disclosed materials is that the plates produced have uneven printing quality. Unsatisfactory printing results are obtained with alcoholic and aqueous flexographic printing inks, because, inadequate ink transfer in printing leads to ink defects. The transfer of 5% dots is particularly prone to defects in the use of such printing inks.

Accordingly, the object of the present invention is to eliminate the printing difficulties discussed above and make available solid, photopolymerizable printing elements for preparing flexographic printing plates having improved ink transfer. In addition, conventional wash-off development with organic solvents should be feasible. At the same time, other properties of the photopolymerizable printing plates should not be affected adversely. For example, a reduction in photosensitivity should be avoided and the flexographic printing plates should not swell in printing inks, because undesirable dot growth and consequently, defective printing results are obtained.

Surprisingly, the above-mentioned objectives are achieved using plates prepared from a photopolymerizable printing element comprising (a) a support, (b) a photopolymerizable layer having at least one elastomeric binder, at least one ethylenically unsaturated monomer addition-polymerizable by actinic radiation, and a photoinitiator or photoinitiator system, (c) an elastomeric layer having at least one thermoplastic, elastomeric block copolymer, and (d) a cover sheet.

SUMMARY OF THE INVENTION

The invention relates to a photopolymerizable printing element comprising:

(a) a support;

(b) a photopolymerizable layer containing at least one elastomeric binder, at least one ethylenically unsaturated monomer addition-polymerizable by actinic radiation, and a photoinitiator or photoinitiator system;

(c) an elastomeric layer containing at least one thermoplastic, elastomeric block copolymer; and (d) a cover sheet, wherein in the elastomeric layer (c) further comprises at least one polymer with the structural unit A:

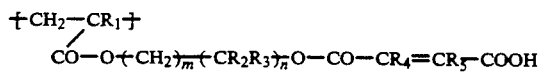

wherein $R_1$ is selected from the group consisting of H and $CH_3$, $R_2$ and $R_3$ can be the same or different and are selected from the group consisting of H, alkyl, substituted alkyl, aryl, and substituted aryl or aryl groups, $R_4$ and $R_5$ can be the same or different and are selected from the group consisting of H, alkyl, and substituted alkyl, and m and n are integers from 0 to 10, whereby the sum of m and n is an integer from 2 to 20.

In another aspect, the invention relates to a process for preparing a photopolymerizable element.

In a further aspect, the invention relates to a process for making a coating solution for the elastomeric layer (c) of the photopolymerizable element.

The invention also relates to a process for preparing flexographic printing plates.

DETAILED DESCRIPTION OF THE INVENTION

The elastomeric layer (c) of the invention has at least one thermoplastic, elastomeric block copolymer and at least one polymer having the structural unit A:

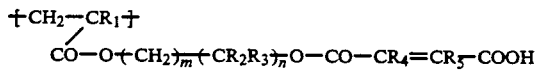

wherein $R_1$ is selected from the group consisting of H and $CH_3$, $R_2$ and $R_3$ can be the same or different and are selected from the group consisting of H and substituted or unsubstituted alkyl or aryl groups, $R_4$ and $R_5$ can be the same or different and are selected from the group consisting of H and substituted or unsubstituted alkyl groups, and m and n have values from 0 to 10, whereby the sum of m and n can equal 2 to 20.

Surprisingly and unexpectedly, the relatively polar polymers essential to the invention are satisfactorily compatible with the thermoplastic, elastomeric block copolymers of elastomeric layer (c). One skilled in the art would have expected these polymers to be incompatible with each other or at least show limited compatibility and therefore, when the various layers of a photopolymerizable printing plate are calendered together, the polymers of the invention would exude out of the elastomeric layer. In addition, one skilled in the art would expect the layers comprising the photopolymerizable element and the printing plate prepared therefrom, would separate from one another because of the incompatibility of the polymers of the invention with the other components.

Contrary to above-mentioned expectations, the flexographic printing element of the claimed invention and the printing plates prepared therefrom, have high stability and uniform properties.

Furthermore, conventional development with organic solvents is possible without the use of special additives, although the polymers essential to the invention behave in solution altogether differently from the other components of the photopolymerizable printing plate, as the above-cited use of structurally similar polymers in aqueous-developable materials exemplifies. Surprisingly, the polymers essential to the invention do not wash off and the invention's printing plates are not swollen by polar flexographic printing inks, as an expert would have expected on the basis of experience with aqueous-developable printing plates.

In addition, troublesome dye uptake and coloring of the printing surface is not observed, despite apprehensions about using compounds structurally similar to the polymers essential to the invention in materials for the preparation of color filters. To the contrary, the printing performance of solvent-developable printing plates for flexographic printing is significantly improved by the addition of the invention's polymers to the elastomeric layer (c). In addition, ozone resistance is increased.

The essential part of the invention's polymers is the structural unit A:

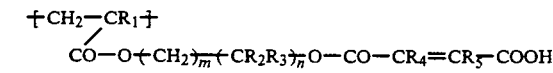

The radical $R_1$ is selected from the group consisting of H and $CH_3$ so that the polymer framework is built of acrylic and methacrylic acid units. $R_2$ and $R_3$ can be the same or different and are selected from the group consisting of H and substituted or unsubstituted alkyl or aryl groups, and m and n have values from 0 to 10, whereby the sum of m and n should equal 2 to 20. H and unsubstituted alkyl groups are preferred for $R_2$ and $R_3$ and values from 1 to 8 are preferred for m and n; H and alkyl groups having 1 to 5 carbon atoms and values for m and n from 1 to 5 are particularly preferred. $R_4$ and $R_5$ can be the same or different and are selected from the group consisting of H and substituted and unsubstituted alkyl groups, H and unsubstituted alkyl groups being preferred, and H and alkyl groups having 1 to 6 carbon atoms being particularly preferred.

The polymers of the invention can consist of 100 percent by weight of structural units A. However, copolymers consisting of 50-95 percent by weight, or preferably 75 to 95 percent by weight, of A can also be used.

Acrylates, methacrylates, ethylenically unsaturated aromatics and hydrocarbons with conjugated double bonds are suitable as comonomers.

The elastomeric layer (c) contains 5 to 30 percent by weight of the polymers of the invention. Anything less than 5 percent by weight provides no significant improvement in printing quality. If more than 30 percent by weight is used, the resistance of the flexographic printing plate to alcoholic and aqueous flexographic printing inks is too low, and this leads to swelling of the printing surface with consequent dot growth. If polymers made up only of structural unit A are used, 10 to 20 percent by weight is preferred and 10 to 15 percent by weight is particularly preferred. If copolymers with the above-named comonomers are used, 15 to 30 percent by weight is preferred, and 18 to 25 percent by weight is particularly preferred.

The elastomeric layer (c) contains a binder at 50-95 percent by weight of at least one thermoplastic, elastomeric block copolymer, such as disclosed in EP-B1 00 84 851 (U.S. Pat. Nos. 4,427,759 and 4,460,675). The average molecular weight of the block copolymers should be over 80,000, preferably over 100,000. Block copolymers with 10 to 30 percent by weight, preferably 10 to 20 percent by weight, of polystyrene end blocks are preferred. Two-block and three-block copolymers with polystyrene and polybutadiene or polyisoprene blocks are particularly preferred. Radial (polystyrene/-polybutadiene)$_4$Si block copolymers, for example, with a polystyrene content of 10 to 30 percent by weight, can be primarily used as binders.

The elastomeric layer (c) can also contain 0 to 40 percent by weight of other polymers, preferably thermoplastic polymers. Examples include polymers and copolymers of methyl methacrylate/acrylonitrile/-butadiene/styrene, styrene/methyl methacrylate, acrylonitrile/butadiene/styrene, butadiene, isoprene, chloroprene, styrene/butadiene, styrene/isoprene or mixtures thereof. Especially suitable are thermoplastic polymers having a turbidity, according to ASTM D 1003, equal to or less than 20%, preferably equal to or less than 12%, and a Rockwell hardness, measured according to ASTM D 785 equal to or greater than 50, preferably greater than 80.

Dyes, fillers, plasticizers, solvents, etc. such as those disclosed in EP-B1 00 84 851 (U.S. Pat. Nos. 4,427,759 and 4,460,675) can be used as conventional additives.

The elastomeric layer (c) should be 0.01 to 0.5 mm thick and preferably 0.025 to 0.12 mm thick.

The layer can be applied by coating from solvents, such as toluene, acetone, methylene chloride, perchloroethylene, methyl ethyl ketone, methyl isobutyl ketone or mixtures thereof, etc., or by extrusion coating directly onto the cover sheet (d), such as for example, a polyethylene terephthalate sheet, or onto a flexible, polymeric sheet (e) located on the cover sheet (d). Significant improvement in coating quality can be achieved provided the thermoplastic polymer is not dissolved together with other components for preparing the coating solution for elastomeric layer (c). For example, improvements in coating quality can be achieved by (i) dissolving the thermoplastic polymer separately in the solvent, (ii) prefiltering the polymer-solvent solution, and (iii) adding the solution to a solution of the remaining coating components. The polymeric sheet (e), is 0.0025 mm to 0.04 mm in thickness and is soluble in the developer solvent for the photopolymerizable layer (b), or at least, can be stripped off therein. The sheet preferably consists of a polyamide, an ethylene/vinyl acetate copolymer, or similar polymers.

Polymers with structural unit A essential to the invention can be added as finished polymers to the coating or extrusion mixture for preparing layer (c). Alternatively, the polymers can be prepared directly in this layer, after coating or extruding an elastomeric mixture containing appropriate quantities of starting monomers of the invention's polymers and a photoinitiator, by diffuse exposure of such a layer with actinic radiation. The starting monomers have the formula B:

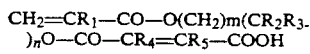
$CH_2=CR_1-CO-O(CH_2)m(CR_2R_3-)_nO-CO-CR_4=CR_5-COOH$ wherein $R_1$ is selected from the group consisting of H and $CH_3$, $R_2$ and $R_3$ can be the same or different and are selected from the group consisting of H and substituted or unsubstituted alkyl or aryl groups, $R_4$ and $R_5$ can be the same or different and are selected from the group consisting of H and substituted or unsubstituted alkyl groups, and m and n have values 0 to 10, whereby the sum of m and n can equal 2 to 20.

The photopolymerizable layer (b) of the invention contains at least one elastomeric binder. Suitable binders include the block copolymers described in DE-C3 22 15 090 (U.S. Pat. Nos. 4,323,636; 4,323,637; 4,369,246; and 4,423,135), U.S. Pat. No. 4,320,188; and U.S. Pat. No. 4,162,919. Preferred block copolymers are the A-B-A type having an elastomeric block, for example, polybutadiene or polyisoprene, between two thermoplastic blocks, for example, polystyrene. Linear and radial block copolymers with polystyrene end blocks are especially preferred, such as, for example, polystyrene/polyisoprene/polystyrene, (polystyrene/polybutadiene)$_4$Si or (polystyrene/polyisoprene)$_4$Si.

The average molecular weight of the block copolymers should be between 80,000 and 300,000, and preferably between 100,000 and 250,000. The polystyrene proportion should be 10 to 40 percent by weight, and preferably 15 to 30 percent by weight.

The photopolymerizable layer (b) also contains at least one ethylenically unsaturated monomer addition-polymerizable by actinic radiation. Monomers having one ethylenically unsaturated group as well as those having several ethylenically unsaturated groups can be used in practicing the invention. The monomers can be used alone or also in combination with one another. Monomer mixtures of monounsaturated acrylates and/or methacrylates and polyunsaturated acrylates and/or methacrylates are preferred. Such mixtures are described in DE-C1 37 44 243 (U.S. Ser. No. 07/274,464).

Monomers suitable for practicing the invention include octyl acrylate, isodecyl acrylate, isodecyl methacrylate, 2-hexyloxyethyl acrylate, 1,4-butanediol diacrylate, 1,6-hexanediol diacrylate, 1,6-hexanediol dimethacrylate, and trimethylol propane triacrylate.

In addition, the photopolymerizable layer (b) contains a photoinitiator or photoinitiator system, such as, for example, α-methyl benzoin, benzophenone, benzil dimethyl ketal, or ethyl anthraquinone/4,4'-bis(dimethylamino)benzophenone. The photopolymerizable layer (b) can also contain other additives, such as, for example, fillers, dyes, antioxidants, and plasticizers, as disclosed in EP-B1 00 84 851 (U.S. Pat. Nos. 4,427,759 and 4,460,675). Plasticizers, 0-30 percent by weight, based on polystyrene or polybutadiene and with an average molecular weight between 1,000 and 10,000, are preferred.

The photopolymerizable layer (b) generally contains 65-95 percent by weight binder, 5-30 percent by weight monomer or monomer mixture, and 0.5-5 percent by weight initiator.

The photopolymerizable layer rests on a support layer (a). Suitable supports include aluminum, steel or synthetic resin sheets. Polyester sheets that are optionally coated with an adhesive layer and/or an antihalation layer, are preferred. Polyethylene terephthalate sheets are especially preferred.

The photopolymerizable printing element of the invention is preferably prepared by the process described in EP-B1 00 84 851 (U.S. Pat. Nos. 4,427,759 and 4,460,675). In this process, a previously extruded photopolymerizable composition is fed into the nip of a calender and calendered between a support and a cover element comprising a cover sheet (d) optionally a flexible sheet (e), and the elastomeric layer (c) of the invention. A photopolymerizable layer bounded on one side by the support and on the other side by elastomeric layer (c) of the cover element is thus formed.

The photopolymerizable printing element prepared in the manner discussed above, is cooled and optionally pre-exposed with actinic radiation through the support. The cover sheet is usually removed, and an image-bearing transparency is placed on the photopolymerizable printing plate. The element is then exposed through the transparency with actinic radiation. The optional, flexible, polymeric sheet (e), and the non-crosslinked areas of the photopolymerizable layer (b), and of the elastomeric layer (c) are removed by washoff with a developer solvent. Developers particularly suitable for this purpose include organic solvents, such as chlorinated hydrocarbons. Examples include, 1,1,1-trichloroethane, or saturated or aromatic hydrocarbons, that can be optionally mixed with alcohols, such as, for example, n-butanol. The solvents disclosed in German Patent Application P 38 28 551.7 (U.S. Ser. No. 07/604,986) are preferred. The solvent can be applied in any manner for development. For example, drenching, immersing, spraying, or roller application are all acceptable methods for applying the developer. Removal of non-crosslinked areas of the layer can be facilitated with brushes. Following development, the resulting printing plate is dried at 40° to 75° C. and then postexposed and/or treated for example, with a solution containing free halogen, to produce a non-tacky surface. The postexposure and treatment steps can take place in any sequence.

The following examples serve to illustrate the practice of the present invention.

EXAMPLES

In the following examples, percents and parts are by weight, unless otherwise stated.

COMPARATIVE EXAMPLE 1

| | |
|---|---|
| Polystyrene/polyisoprene/polystyrene block copolymer 15% polystyrene, Brookfield viscosity 1600 mPa.s (25% in toluene) | 67.4% |
| Methyl methacrylate/acrylonitrile/ butadiene/styrene tetrapolymer 46/9/14/31 | 31.3% |
| Acid blue (C.I. 13390) | 1.3% |

A multilayer cover element was prepared according to the following procedure. The dye and the tetrapolymer were kneaded together at 116° C. and then extruded and granulated. The mixture and the remaining components of elastomeric layer (c) were processed in a 15% solution in methylene chloride. The resulting coating solution was then applied, by means of an extrusion slit coater with a 0.38 mm slit width, onto the polyamide coating of a polyethylene terephthalate support, as described in Example 1 of EP-B1 00 84 851 (U.S. Pat. Nos. 4,427,759 and 4,460,675), dried, and provided with a silicone-coated polyethylene terephthalate protective layer. The dry layer thickness was 0.051 mm.

A flexographic printing element was prepared according to the following procedure. A photopolymerizable mixture was prepared, as in Example 1 of EP-B1 00 84 851, in a twin-screw extruder, extruded, and calendered between a polyethylene terephthalate support and the elastomeric layer (c) of the above-described cover element. Before calendaring, the polyethylene terephthalate protective layer was removed. The photopolymerizable mixture contained the following ingredients:

| | Parts |
|---|---|
| 2,2-dimethoxy-2-phenyl acetophenone | 1.4 |
| Hexamethylene glycol diacrylate | 5.3 |
| Hexamethylene glycol dimethacrylate | 3.7 |
| 2,6-di-tert-butyl-p-cresol | 0.166 |
| Hydroquinone | 0.001 |
| Red dye (C.I. 109) | 0.003 |
| Hydroxyethyl methacrylate | 0.13 |
| Polystyrene/polyisoprene/polystyrene block copolymer (15% polystyrene molecular weight 150,000) | 82.3 |
| α-methyl styrene/vinyl toluene resin | 6 |
| Microcrystalline hydrocarbon wax | 1 |

Following cooling, overall backside exposure through the support, and removal of the polyethylene terephthalate cover layer, an image-bearing transparency was placed on the polyamide layer, and the printing plate was exposed through the transparency with actinic radiation for 6 minutes. The photopolymerizable printing plate was developed by washoff with a tetrachloroethylene/n-butanol mixture (75/25 percent by volume), whereby the polyamide layer, and the unexposed areas of the photopolymerizable layer (b), and of the elastomeric layer (c) were removed. As in Example 1 of EP-B1 00 84 851, the flexographic printing plate was dried, treated with aqueous hypochlorite solution, and post-exposed.

EXAMPLE 2

Composition of elastomeric layer (c)

| | |
|---|---|
| Polystyrene/polyisoprene/polystyrene block copolymer 15% polystyrene, Brookfield viscosity 1600 mPa.s (25% in toluene) | 58.7% |
| Methyl methacrylate/acrylonitrile/ butadiene/styrene tetrapolymer, 46/9/14/31 | 27.3% |
| Acid blue (C.I. 13390) | 1.2% |
| Mono-2-acryloyloxyethyl ester of maleic acid | 11.6% |
| Benzil dimethyl ketal | 1.16% |
| Hydroquinone | 0.04% |

A 17% solution in methylene chloride was processed as described in Example 1 to make elastomeric layer (c). The layer was dried and then exposed 1 minute to diffuse light from a UV lamp (180 watts high pressure mercury lamp) and laminated on a light-sensitive flexographic plate as in Example 1. The resulting printing plate was processed further as described in Example 1. Photosensitivity, exposure latitude, and development performance corresponded to the printing plate of Example 1.

EXAMPLE 3

Composition of elastomeric layer (c)

| | |
|---|---|
| Polystyrene/polyisoprene/polystyrene block copolymer 15% polystyrene, Brookfield viscosity 1600 mPa.s (25% in toluene) | 58.7% |
| Methyl methacrylate/acrylonitrile/ butadiene/styrene tetrapolymer, 46/9/14/31 | 27.3% |
| Acid blue (C.I. 13390) | 1.2% |
| Mono-2-methacryloyloxyethyl ester of maleic acid | 11.6% |
| Benzil dimethyl ketal | 1.16% |
| Hydroquinone | 0.04% |

The elastomeric layer (c) was prepared and all subsequent processing steps were carried out as described in Example 2. Photosensitivity, exposure latitude, and development performance corresponded to the printing plate of Example 1.

EXAMPLE 4 a) Polymethacrylic acid hydroxypropyl ester and maleic anhydride (1:1) were heated 2 hours at 80° C. in dimethylsulfoxide as the solvent. The resulting monomaleate was precipitated by the addition of water and then dried.

b) Composition of elastomeric layer (c)

| | |
|---|---|
| Polystyrene/polyisoprene/polystyrene block copolymer 15% polystyrene, Brookfield viscosity 1600 mPa.s (25% in toluene) | 57.4% |
| Methyl methacrylate/acrylonitrile/butadiene/styrene tetrapolymer, 46/9/14/31 | 26.7% |
| Acid blue (C.I. 13390) | 1.1% |
| Polymer prepared according to a) | 14.8% |

A 17% solution in toluene/dimethyl formamide (9:1) was processed as in Example 1 to make elastomeric layer (c). Subsequent processing followed as in Example 1. Photosensitivity, exposure latitude, and development performance corresponded to the printing plate of Example 1.

EXAMPLE 5

Composition of elastomeric layer (c)

| | |
|---|---|
| Polystyrene/polyisoprene/polystyrene block copolymer 15% polystyrene, Brookfield viscosity 1600 mPa.s (25% in toluene) | 58.1% |
| Methyl methacrylate/acrylonitrile/butadiene/styrene tetrapolymer, 46/9/14/31 | 27.9% |
| Acid blue (C.I. 13390) | 1.2% |
| Mono-2-acryloyloxyethyl ester of maleic acid | 11.6% |
| Benzil dimethyl ketal | 1.16% |
| Hydroquinone | 0.04% |

The above-listed components of elastomeric layer (c) were kneaded together and extruded onto the polyamide coating of a polyethylene terephthalate support. Subsequent processing followed as described in Example 1. Photosensitivity, exposure latitude, and development performance corresponded to the printing plate of Example 1.

EXAMPLE 6

Composition of elastomeric layer (c)

| | |
|---|---|
| Radial polystyrene/butadiene/polystyrene block copolymer, 30% polystyrene, solution viscosity 9.1 mm²/s (5.23% in toluene) | 56% |
| Methyl methacrylate/acrylonitrile/butadiene/styrene tetrapolymer, 46/9/14/31 | 28% |
| Acid blue (C.I. 13390) | 1% |
| Mono-2-methacryloyloxyethyl ester of maleic acid | 13% |
| Benzil dimethyl ketal | 1.9% |
| Hydroquinone | 0.1% |

The above elastomeric layer (c) was prepared along with the subsequent processing steps according to the procedure described in Example 2. Photosensitivity, exposure latitude, and development performance corresponded to the printing plate of Example 1.

Printing test

Printing trials were conducted on a white pigmented polyethylene sheet with an alcoholic flexographic printing ink (cyan, viscosity 29 mPa·sec/DIN 53211), using a flexographic printing machine with a screen cylinder with 170 lines/cm and 5 g/m² at a printing rate of 80 m/min.

The printing plates of the invention yielded higher full-tone densities and better reproduction of lines and solid areas than the comparison material.

What is claimed is:

1. A photopolymerizable printing element comprising:
   (a) a support;
   (b) a photopolymerizable layer containing at least one elastomeric binder, at least one ethylenically unsaturated monomer addition-polymerizable by actinic radiation, and a photoinitiator or photoinitiator system;
   (c) an elastomeric layer containing at least one thermoplastic, elastomeric block copolymer; and
   (d) a cover sheet, wherein the elastomeric layer (c) further comprises at least one polymer with the structural unit A:

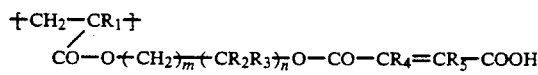

wherein $R_1$ is selected from the group consisting of H and $CH_3$, $R_2$ and $R_3$ can be the same or different and are selected from the group consisting of H, alkyl, substituted alkyl, aryl, and substituted aryl, $R_4$ and $R_5$ can be the same or different and are selected from the group consisting of H, alkyl, and substituted alkyl, and m and n are integers from 0 to 10, provided that the sum of m and n is an integer from 2 to 20.

2. The photopolymerizable printing element of claim 1, wherein the elastomeric layer (c) contains 5 to 30 percent by weight of a polymer with the structural unit A.

3. The photopolymerizable printing element of claim 1 or 2, wherein the elastomeric layer (c) is obtained by exposing overall a photopolymerizable layer containing at least one compound of formula B:

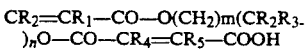

wherein $R_1$ is selected from the group consisting of H and $CH_3$, $R_2$ and $R_3$ can be the same or different and are selected from the group consisting of H and substituted or unsubstituted alkyl or aryl groups, $R_4$ and $R_5$ can be the same or different and are selected from the group consisting of H and substituted or unsubstituted alkyl groups, and m and n have values 0 to 10, whereby the sum of m and n can equal 2 to 20.

4. The photopolymerizable printing element of claim 1, wherein the elastomeric layer (c) contains 50–95 percent by weight of a thermoplastic, elastomeric block copolymer having a polystyrene content of 10–30 percent by weight.

5. The photopolymerizable printing element of claim 1, wherein the elastomeric layer (c) contains at least one radial (polystyrene/polybutadiene)₄Si block copolymer having a polystyrene content of 15–30 percent by weight.

6. The photopolymerizable printing element of claim 1, wherein the elastomeric layer (c) contains 0–40 percent by weight of a polymer having a turbidity equal to or less than 20%, and a Rockwell hardness equal to or greater than 50.

7. The photopolymerizable printing plate of claim 1, wherein a flexible polymeric sheet (e) is interposed between the elastomeric layer (c) and the cover sheet (d).

8. A process for preparing photopolymerizable printing elements comprising:
(A) feeding into the nip of a calender a photopolymerizable composition containing at least one elastomeric binder, at least one ethylenically unsaturated monomer addition-polymerizable by actinic radiation, and a photoinitiator or photoinitiator system; and
(B) calendering the composition between a support (a) and a multilayer cover element to form a photopolymerizable layer (b) between them, whereby the multilayer cover element comprises an elastomeric layer (c) containing at least one thermoplastic, elastomeric block copolymer, and a cover sheet (d),
wherein the elastomeric layer (c) further comprises at least one polymer with the structural unit A:

wherein $R_1$ is selected from the group consisting of H and $CH_3$, $R_2$ and $R_3$ can be the same or different and are selected from the group consisting of H, alkyl, substituted alkyl, aryl, and substituted aryl, $R_4$ and $R_5$ can be the same or different and are selected from the group consisting of H, alkyl, and substituted alkyl and m and n are integers from 0 to 10, provided that the sum of m and n is an integer from 2 to 20.

* * * * *